United States Patent
Jin

(10) Patent No.: US 10,394,973 B2
(45) Date of Patent: Aug. 27, 2019

(54) METHODS AND APPARATUS FOR USING ANALYTICAL/STATISTICAL MODELING FOR CONTINUED PROCESS VERIFICATION (CPV)

(71) Applicant: Fisher-Rosemount Systems, Inc., Round Rock, TX (US)

(72) Inventor: Zuwei Jin, Audubon, PA (US)

(73) Assignee: FISHER-ROSEMOUNT SYSTEMS, INC., Round Rock, TX (US)

( * ) Notice: Subject to any disclaimer, the term of this patent is extended or adjusted under 35 U.S.C. 154(b) by 503 days.

(21) Appl. No.: 14/974,458

(22) Filed: Dec. 18, 2015

(65) Prior Publication Data

US 2017/0177754 A1    Jun. 22, 2017

(51) Int. Cl.
  *G06F 7/06* (2006.01)
  *G06F 17/50* (2006.01)
  (Continued)

(52) U.S. Cl.
  CPC ......... *G06F 17/5009* (2013.01); *G05B 17/02* (2013.01); *G05B 19/4184* (2013.01);
  (Continued)

(58) Field of Classification Search
  CPC ..... G06F 17/5009; G06F 17/18; G05B 17/02; G05B 19/4184; Y02P 90/02; Y02P 90/22; Y02P 90/26
  See application file for complete search history.

(56) References Cited

U.S. PATENT DOCUMENTS

| 6,738,682 B1 * | 5/2004 | Pasadyn ................. G05B 13/04 |
| | | 700/100 |
| 7,248,998 B2 | 7/2007 | De Martini |
| | | (Continued) |

FOREIGN PATENT DOCUMENTS

GB    2494778    3/2013

OTHER PUBLICATIONS

Alsmeyer et al., "A Case for Stage 3 Continued Process Verification", Pharmaceutical Manufacturing, May 21, 2014, 13 pages.
(Continued)

*Primary Examiner* — Brian W Wathen
*Assistant Examiner* — Abdou K Seye
(74) *Attorney, Agent, or Firm* — Hanley, Flight & Zimmerman, LLC

(57) ABSTRACT

Methods and apparatus for using analytical/statistical modeling to perform continued process verification (CPV) are described. Example methods include determining distribution characteristics for a plurality of parameters based on a first historical batch dataset measured while manufacturing a first batch at a first time, and generating a model batch based on the distribution characteristics of the plurality of parameters. Example methods also include generating a first set of simulated batch datasets corresponding to a first set of simulated batches by, for each one of the first set of simulated batches: generating values for the plurality of parameters based on the model batch, and determining a quality prediction based on the generated values. The example methods also include generating a model based on the first set of simulated batch datasets and the first historical batch dataset. The model is to be implemented to monitor a subsequent manufacture of a second batch.

19 Claims, 6 Drawing Sheets

(51) Int. Cl.
G06F 17/18 (2006.01)
G05B 17/02 (2006.01)
G05B 19/418 (2006.01)

(52) U.S. Cl.
CPC .............. *G06F 17/18* (2013.01); *Y02P 90/14* (2015.11); *Y02P 90/18* (2015.11); *Y02P 90/22* (2015.11); *Y02P 90/26* (2015.11)

(56) References Cited

U.S. PATENT DOCUMENTS

| 8,694,290 | B2 | 4/2014 | Kareem et al. | |
| 2005/0096963 | A1* | 5/2005 | Myr | G06Q 10/06375 |
| | | | | 705/7.35 |
| 2007/0078530 | A1 | 4/2007 | Blevins et al. | |
| 2010/0063611 | A1* | 3/2010 | Patel | G05B 23/024 |
| | | | | 700/108 |
| 2011/0276169 | A1 | 11/2011 | Bourg, Jr. et al. | |
| 2011/0288660 | A1* | 11/2011 | Wojsznis | G05B 23/024 |
| | | | | 700/30 |
| 2015/0005903 | A1 | 1/2015 | Worek et al. | |
| 2016/0259357 | A1* | 9/2016 | Wepman | G06F 16/29 |

OTHER PUBLICATIONS

Payne et al., "Continued Process Verification for Biopharma Manufacturing", BioPharm International, vol. 27, Issue 10, Oct. 1, 2014, 4 pages.

"Process Validation: General Principles and Practices" U.S. Department of Health and Human Services, Food and Drug Administration, Center for Drug Evaluation and Research (CDER), Center for Biologics Evaluation and Research (CBER), Center for Veterinary Medicine (CVM), Jan. 2011, 22 pages.

United Kingdom Intellectual Property Office, "Search Report," issued in connection with Patent Application No. GB1621305.0, dated Jun. 1, 2017, 4 pages.

* cited by examiner

METHODS AND APPARATUS FOR USING ANALYTICAL/STATISTICAL MODELING FOR CONTINUED PROCESS VERIFICATION (CPV)

FIELD OF THE DISCLOSURE

This disclosure relates generally to controlling and monitoring process control systems and, more particularly, to methods and apparatus for using analytical/statistical modeling for continued process verification (CPV).

BACKGROUND

Process control systems typically include one or more process controllers communicatively coupled to at least one host or operator workstation and to one or more field devices via analog, digital or combined analog/digital buses. The field devices, which may be, for example, device controllers, valves, valve positioners, switches and transmitters (e.g., temperature, pressure and flow rate sensors), perform functions within the process control system such as opening or closing valves and measuring process parameters.

Process control systems used to manufacture important products (e.g., human pharmaceuticals, animal pharmaceuticals, biological products, etc.) have high quality (e.g., purity, reliability, consistency, etc.) standards and are regulated by government agencies (e.g. the Food and Drug Administration, the U.S. Department of Health and Human Services, etc.). These process control systems are recommended and may soon be required by FDA to provide statistical data that shows the product quality is consistently meeting quality specifications and the process is running in a state of control

BRIEF DESCRIPTION OF THE DRAWINGS

Wherever possible, the same reference numbers will be used throughout the drawing(s) and accompanying written description to refer to the same or like parts.

SUMMARY

Figure 1:
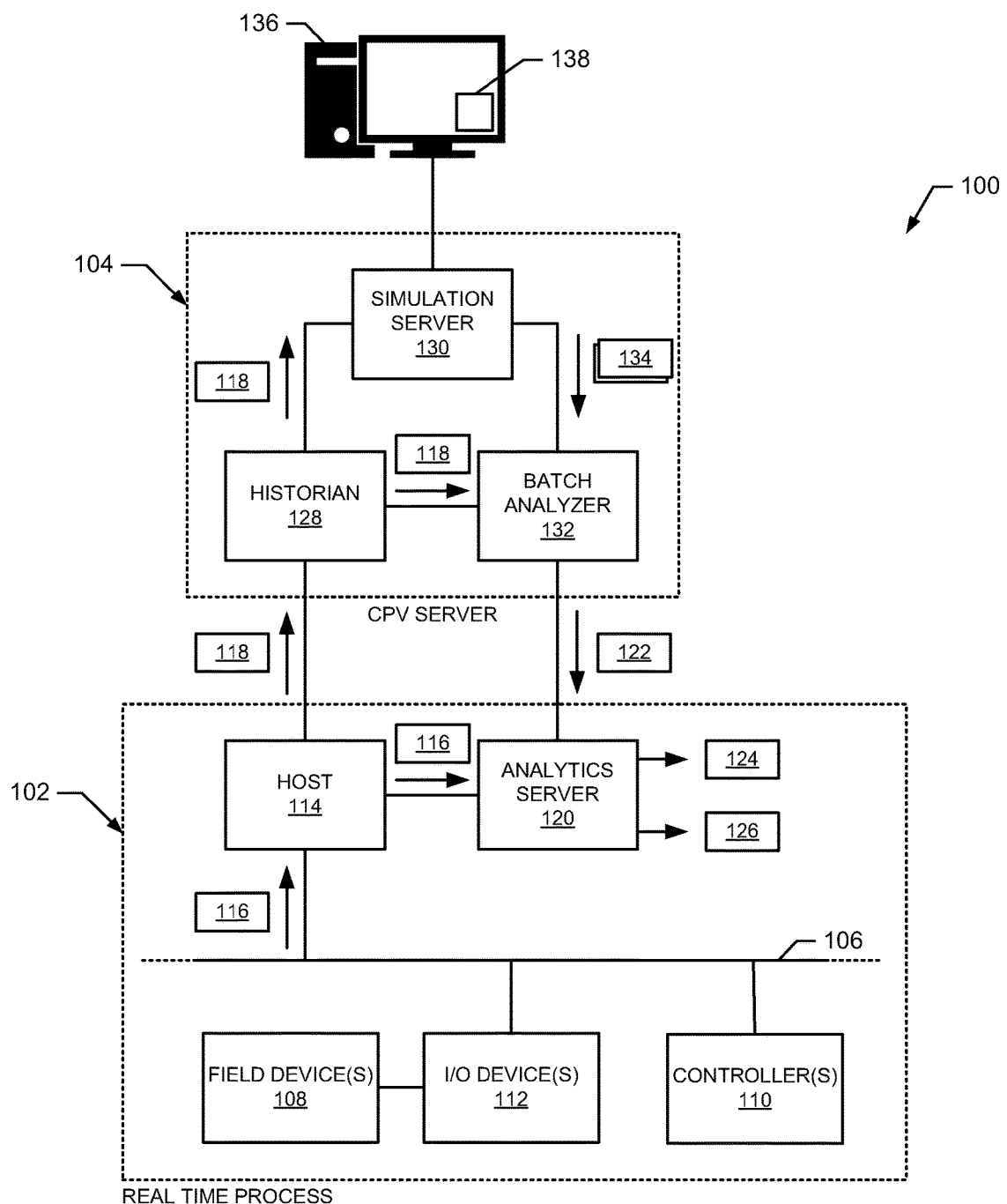
FIG. 1 illustrates an example process control system.

Example disclosed methods involve determining distribution characteristics for a plurality of parameters based on a first historical batch dataset measured while manufacturing a first batch at a first time, and generating a model batch based on the distribution characteristics of the plurality of parameters. Example methods also include generating a first set of simulated batch datasets corresponding to a first set of simulated batches by, for each batch of the first set of simulated batches: generating values for the plurality of parameters based on the model batch, and determining a quality prediction based on the generated values. The example disclosed methods also include generating a model based on the first set of simulated batch datasets and the first historical batch dataset, the model to be implemented to monitor a subsequent manufacture of a second batch.

Example disclosed apparatus include a parameter analyzer to determine distribution characteristics for a plurality of parameters based on a first historical batch dataset including the plurality of parameters measured while manufacturing a first batch at a first time, and generate a model batch based on the determined distribution characteristics for the plurality of parameters. The example disclosed apparatus also include a parameter generator to, for each one of a first set of simulated batches, generate values for the plurality of parameters based on the model batch. The generated values are to be included in a first set of simulated batch datasets. The example disclosed apparatus also include a quality predictor to, for each one of the first set of simulated batches, determine a quality prediction based on the generated values. The quality prediction is to be included in a first set of simulated batch datasets. Additionally, the example disclosed apparatus also include a batch analyzer to generate a model based on the first set of simulated batch datasets and the first historical batch dataset, the model to be implemented to monitor a subsequent manufacture of a second batch.

Example disclosed articles of manufacture include instructions which, when executed, cause a machine to determine distribution characteristics for a plurality of parameters based a first historical batch dataset measured while manufacturing a first batch at a first time. The example disclosed articles of manufacture also include instructions which, when executed, cause a machine to generate a model batch based on the distribution characteristics of the plurality of parameters. Additionally, the example disclosed articles of manufacture include instructions which, when executed, cause a machine to generate a first set of simulated batch datasets corresponding to a first set of simulated batches by, for each one of the first set of simulated batches: generating values for the plurality of parameters based on the model batch, and determining a quality prediction based on the generated values. The example disclosed articles of manufacture include instructions which, when executed, cause a machine to generate a model based on the first set of simulated batch datasets and the first historical batch dataset, the model to be implemented to monitor a subsequent manufacture of a second batch.

DETAILED DESCRIPTION

The present disclosure relates generally to controlling and monitoring process control systems and, more particularly, to methods and apparatus for continued process verification (CPV). Process control systems include workstations and/or servers that interact with system controllers, device controllers, and/or field devices located in the process control system. In examples disclosed herein, the device controllers execute process control applications in addition to primary process control functions executed by firmware of the device controllers. The field devices may be, for example, heating elements, mixers, valves, valve positioners, switches and transmitters, and may perform process control functions such as opening or closing valves, controlling temperatures, and measuring process control parameters. Device controllers generate process data based on information (e.g., the process control parameters) received from the field devices. The process data includes process statistics, alarms, monitoring information, process trend information, diagnostic information, automation device status information, and/or messages from the automation devices.

In a process control system that manufactures a product in batches, continued process verification (CPV) monitors the process control parameters to (i) determine whether, during the manufacturing of the batch, the process control system is statistically remaining in a state of control, and to (ii) predict the quality of the batch. As used herein, a batch is a quantity of a product manufactured by a single run of the process control system. Current CPV practice involves mostly univariate evaluation of each of the process parameters and quality attributes and the evaluation is usually done after a batch is complete. A process control system with a CPV server uses an analytical/statistical model for real time monitoring. The analytical/statistical model detects variations (e.g., in the field devices, etc.) in the process control system and triggers alarm or directs responses to the variations. For example, the analytical/statistical model may detect combined variations of multiple process control parameters that affect quality of the product, even though variation in a single one of the process control parameters may not affect quality. For example, detecting an elevated temperature and a reduced product flow may affect quality of the product. Traditionally, developing the analytical/statistical model requires historical data from a significant number (e.g., 25, 30, etc.) of batches. In some process control systems, a sufficient number of batches either may never be run or may be run over a long period of time. For example, in the pharmaceutical industry, a product volume and life cycle may result in a limited number (e.g., 10, 15, etc.) of batches of an active pharmaceutical ingredient. Thus, for such a pharmaceutical, the benefits of an analytical/statistical model for CPV may never be realized.

In examples disclosed herein, initially, the analytical/statistical model for CPV is generated with a limited number of historical batch datasets. The historical batch datasets are records of a real time process when manufacturing the corresponding batches. The batch datasets include multiple process control parameters associated with the field devices in the real time process measured over the duration of the batch. A model batch is developed based on the available historical batch datasets. A model batch may be generated based on the dataset associated with a single historical batch dataset or generated based on multiple (e.g., 2, 3, 5, 10, etc.) historical batches. The model batch is used to generate simulated batch datasets to supplement the historical batch datasets. The simulated batch datasets include (i) a simulated set of the process control parameters representative of measurement of the field devices over the duration of the batch, and (ii) a prediction of the quality of the simulated batch based on the simulated set of the process control parameters. The simulated batch datasets are generated until a threshold number of batch datasets (including simulated batch datasets and historical batch datasets) is satisfied (e.g., equaled). For example, if the threshold number of batch datasets is twenty-five and the number of historical batch datasets is two, twenty-three simulated batch datasets are generated. The analytical/statistical model is generated using the historical batches and the simulated batches. In some examples, the analytical/statistical model is generated using primary component analysis (PCA) and/or projected latent structure (PLS). In some examples, when a batch is completed by the process control system (e.g., a new historical batch dataset is created), (i) the model batch is recreated, (ii) the simulated batch datasets are regenerated, and (iii) the analytical/statistical model is regenerated. For example, if the threshold number of batch datasets is twenty-five and the number of historical batches is now three, twenty-two simulated batches are generated using the recreated model batch.

In examples disclosed below, the model batch is generated based on the historical batch datasets. To generate the model batch, the historical batch datasets are analyzed to determine a center value, a minimum value, a maximum value, and/or distribution characteristics (e.g., standard deviation, variance, etc.) for each of the process control parameters (e.g., $P_0 \ldots P_n$, etc.). Based on the center value, the minimum value, the maximum value, and/or the distribution characteristics, the process control parameters are characterized so that the process control parameters can be simulated using a random or pseudo-random input.

When the model batch is generated, the simulated process control parameters for the simulated batch datasets are generated based on the characterizations of the process control parameters by the model batch. In some examples, the simulated process control parameters are generated via a random or pseudo-random calculation such as, for example, the Monte Carlo method. For each of the process control parameters, a quantity of simulated values are generated based on the quantity of values associated with the historical batch datasets. For example, during the historical batches, the output of a temperature probe may be read 2400 times, and the output of a flow meter may be read 1800 times. In such an example, 2400 values for the process control parameter associated with the temperature probe and 1800 values for the process control parameter associated with the flow meter may be simulated.

In the examples disclosed below, the historical batch datasets include quality assessments (e.g., titers, viable cell density, purity, efficacy, etc.) that grade the quality of the product produced by the corresponding historical batch. The process control parameters of the historical batch datasets and the corresponding quality assessments are analyzed to determine a quality predictor. The quality predictor determines a predicted quality value for a simulated batch dataset based on the simulated values of the process control parameters. In some examples, the quality predictor is determined based on minimum mean square errors (MSE) analysis.

FIG. 1 illustrates an example process control system 100. In the illustrated example, the process control system 100 is separated into a real time process 102 and a CPV server 104. The example real time process 102 employs a plant process control architecture that integrates one or more smart plant capabilities including field buses 106 (such as HART® and/or FOUNDATION™ field buses), high-speed discrete buses, embedded advanced control, and advanced unit and batch management. The field buses 106 network field devices 108 inside the real time process 102 and provide an infrastructure for a variety of applications, including device management, configuration, monitoring, and diagnostics, etc.

The example real time process 102 includes the example field devices 108, example controller(s) 110, example I/O devices 112, and an example host 114. The field devices 108 control and/or monitor processes and may, for example, include valves, sensors, proximity switches, motor starters, drives, etc. In the illustrated example, the field devices 108 are commutatively coupled to the I/O devices 112. The I/O devices 112 support a variety of modules to facilitate communication (e.g., via digital and/or analog communication) with a variety of the field devices 108. For example, an I/O device 112 may have an analog module to interface with a three-wire temperature probe and a digital module to interface with a digital valve controller. The I/O devices 112 receive data from the field devices 108 and convert the data into communications capable of being processed by the controller 110.

The example controller 110 is coupled to the host 114 (e.g., a workstation and/or a server) via a wired or wireless network (e.g., a LAN, a WAN, the Internet, etc.). The controller 110 controls routines to calculate process data based on outputs from the field device 108. The controller 110 forwards process data to the host 114 at periodic intervals and/or upon processing or generating the process data. The process data transmitted by the controller 110 may include process control parameters 116, alarm information, text, block mode element status information, diagnostic information, error messages, events, and/or device identifiers, etc.

In the example illustrated in FIG. 1, the host 114 executes process control applications. The process control applications communicate with the example controller 110 to monitor, control, and/or diagnose the field devices 108. For example, the process control applications may include control automation, graphical representations of the real time process 102, change management, process control editing, collection of the process control parameters 116, data analysis, etc. In the illustrated example, the host 114 compiles the process control parameters 116 into historical batch datasets 118 and provides the historical batch datasets 118 to the CPV server 104.

In the example illustrated in FIG. 1, the real time process 102 includes an analytics server 120. The analytics server 120 receives or otherwise retrieves an example analytical/statistical model 122 from the example CPV server 104. The example analytics server 120 monitors the process control parameters 116 in real time or near real time to detect faults 124 and/or to predict quality value(s) 126 based on the analytical/statistical models 122 and the process control parameters 116. The faults 124 represent one or more of the process control parameters 116 being out of an acceptable range. In some examples, the host 114 may adjust the field device(s) 108 associated with detected fault 124. In some examples, the faults 124 and/or the quality values 126 are stored with the corresponding process control parameters 116 as part of the historical batch dataset 118.

The example CPV server 104 includes an example historian 128, an example simulation server 130, and an example batch analyzer 132. The historian 128 receives or otherwise retrieves the historical batch datasets 118 from the real time process 102. The historian 128 stores the historical batch datasets 118. From time to time (e.g. periodically, in response to a new historical batch dataset 118, etc.), the example simulation server 130 retrieves the historical batch datasets 118 from the historian 128 to create simulated batch datasets 134. To create the simulated batch datasets 134, the simulation server 130 generates a model batch that characterizes the process control parameters 116 based on the historical batch dataset(s) 118. Examples of creating the simulated batch datasets 134 are discussed below in connection with FIG. 3. The batch analyzer 132 retrieves the historical batch datasets 118 from the historian 128 and the simulated batch datasets 134 from the simulation server 130. The example batch analyzer 132 uses the example simulated batch datasets 134 and the example historical batch datasets 118 to generate the analytical/statistical model 122. In some examples, the batch analyzer 132 uses primary component analysis (PCA) and/or projected latent structure (PLS) to generate the analytical/statistical model 122.

In some examples, the simulation server 130 provides an application programming interface (API) that facilitates a workstation 136 or any other suitable computing device to interact with the simulation server 130. In such examples, a design space 138 may be provided to the simulation server 130 through a graphical interface. In such manners, an engineer or other suitable person may change the model batch (e.g., select equations that characterize the process control parameters 116 of the historical batch datasets 118, change calculated distribution characteristics, etc.). In some examples, the design space 138 allows the engineer or other suitable person to generate the batch model when there are no historical batch datasets 118 available.

Figure 2:
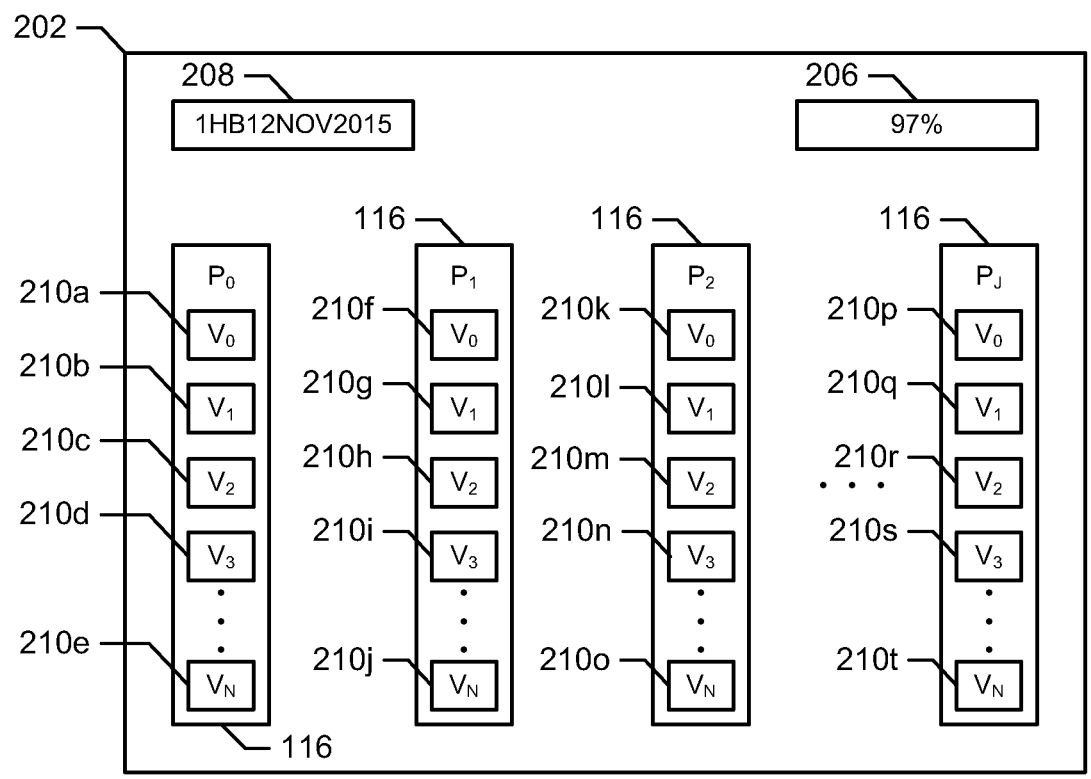
FIG. 2 illustrates an example batch dataset.

FIG. 2 illustrates an example batch dataset 202. The example batch dataset 202 is illustrative of the historical batch datasets 118 and the simulated batch datasets 134. The example batch dataset 202 includes the process control parameters 116, and an example quality field 206. Additionally, in some examples, the batch dataset 202 includes a batch identifier 208 that uniquely identifies the batch dataset 202. For example, if the batch dataset 202 is a historical batch dataset 118, the batch identifier 208 may include a serial number and/or a date associated with the batch of the product.

The example process control parameters 116 are associated with corresponding field devices 108 (FIG. 1) in the real time process 102 (FIG. 1). For example, a first process control parameter 116 may be associated with a thermocouple and a second process control parameter 116 may be associated with a humidity sensor. The example process control parameters 116 include sample values $210a$-$210t$. For the historical batch datasets 118, the example sample values $210a$-$210t$ are samples measured by the field device(s) 108 associated with the corresponding process control parameters 116. For the simulated batch datasets 134, the example sample values $210a$-$210t$ are values generated (e.g., via the Monte Carlo method) from the characterization of the corresponding process control parameters 116 by the model batch.

The example quality field 206 stores a measurement of the quality of product manufactured by the batch corresponding to the batch dataset 202. For example, the quality field 206 may store a value indicating that the product produced by the corresponding batch is 97% pure. For the historical batch datasets 118, the quality field 206 corresponds to the measurement of quality calculated by, for example, a design space or an equation developed through minimum mean square errors (MSE). For the simulated batch datasets 134, the quality field 206 corresponds to the measurement of quality calculated by a quality model.

Figure 3:
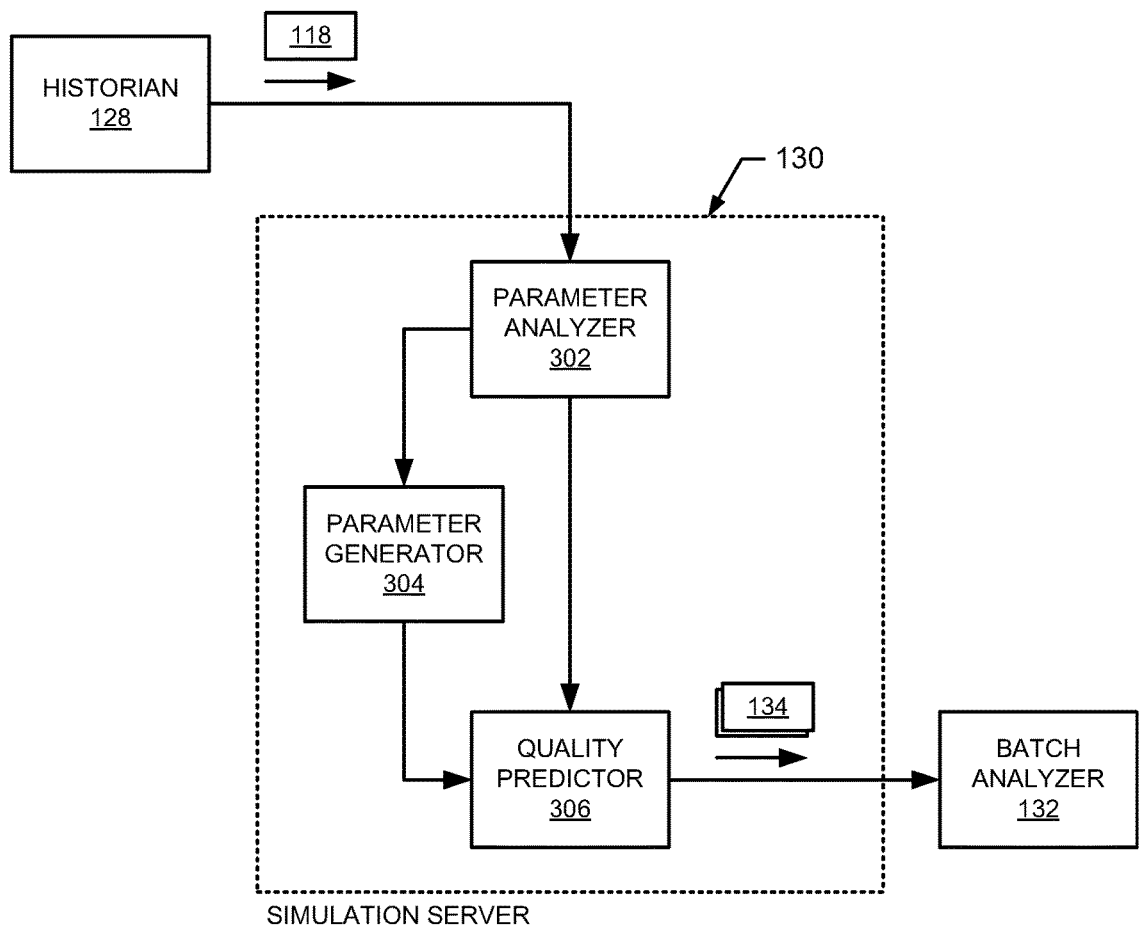
FIG. 3 illustrates the example simulation server of FIG. 1.

FIG. 3 illustrates the example simulation server 130 of FIG. 1. The example simulation server 130 is used to generate the simulated batch datasets 134 when a sufficient number of historical batch datasets 118 is not available to generate the analytical/statistical model 122 of FIG. 1. The simulation server 130 includes an example parameter analyzer 302, an example parameter generator 304, and an example quality predictor 306.

The parameter analyzer 302 retrieves or otherwise receives the historical batch dataset(s) 118 from the historian 128. In the illustrated example, the parameter analyzer 302 generates a model batch that characterizes each of the process control parameters 116 in the historical batch dataset(s) 118. To generate the model batch, the parameter analyzer 302 analyzes the process control parameters 116 of the historical batch dataset(s) 118 to determine the minimum values, the maximum values, the center values (e.g., median values, average values, etc.), and the distribution characteristics (e.g. standard deviation, variance, alpha and beta values, etc.). To characterize the process control parameters 116, the example parameter analyzer 302 builds equations that associate (i) the minimum values, the maximum values, the center values, and/or the distribution characteristics, and (ii) a random or pseudo-random input. In some examples, the parameter analyzer 302 stores prototype equations in association with types of the process control parameters 116 and/or in association with the field devices 108 corresponding to the process control parameters 116. In some examples, the parameter analyzer 302 is communicatively coupled with the design space 138 (FIG. 1) via the API. In some such examples, the parameter analyzer 302 may send the batch model to the design space 138, and receive changes to the batch model from the design space 138.

The example parameter generator 304 generates simulated process control parameters 116 for the simulated batch datasets 134. In the illustrated example, the parameter generator 304 receives the model batch from the parameter analyzer 302. Based on the equations in the model batch, the example parameter generator 304 generates sets of simulated process control parameters 116. In some examples, the parameter generator 304 generates the sets of simulated process control parameters via a random or pseudo-random calculation (e.g., via the Monte Carlo method). The example parameter generator 304 generates enough of the sets of simulated process control parameters 116 so that a quantity of simulated batch datasets 134 can be created to satisfy (e.g., equal) the threshold number of batch datasets. The example parameter generator 304 sends the sets of simulated process control parameters to the example quality predictor 306.

The example quality predictor 306 predicts quality values for the simulated batch datasets 134. The quality predictor 306 receives the historical batch datasets 118 from the parameter analyzer 302 and the sets of simulated process control parameters from the parameter generator 304. In the illustrated example, the quality predictor 306 analyzes the process control parameters 116 and the quality field 206 (FIG. 2) of the historical batch datasets 118 to generate a quality prediction model to predict simulated quality values based on the sets of simulated process control parameters 116. In some examples, the quality predictor 306 uses minimum mean square errors (MSE) analysis to generate the quality prediction model. For each set of the simulated control parameters 116, the quality predictor 306 uses the quality prediction model to assign the simulated quality prediction to the corresponding set of the simulated control parameters to form the simulated batch dataset 134. The quality predictor 306 then sends the simulated batch datasets 134 to the batch analyzer 132 to be used to generate the analytical/statistical model 122.

While an example manner of implementing the simulation server 130 of FIG. 1 is illustrated in FIG. 3, one or more of the elements, processes and/or devices illustrated in FIG. 3 may be combined, divided, re-arranged, omitted, eliminated and/or implemented in any other way. Further, the example parameter analyzer 302, the example parameter generator 304, the example quality predictor 306 and/or, more generally, the example simulation server 130 of FIG. 1 may be implemented by hardware, software, firmware and/or any combination of hardware, software and/or firmware. Thus, for example, any of the example parameter analyzer 302, the example parameter generator 304, the example quality predictor 306 and/or, more generally, the example simulation server 130 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example parameter analyzer 302, the example parameter generator 304, and/or the example quality predictor 306 is/are hereby expressly defined to include a tangible computer readable storage device or storage disk such as a memory, a digital versatile disk (DVD), a compact disk (CD), a Blu-ray disk, etc. storing the software and/or firmware. Further still, the example simulation server 130 of FIG. 1 may include one or more elements, processes and/or devices in addition to, or instead of, those illustrated in FIG. 3, and/or may include more than one of any or all of the illustrated elements, processes and devices.

Figure 4:
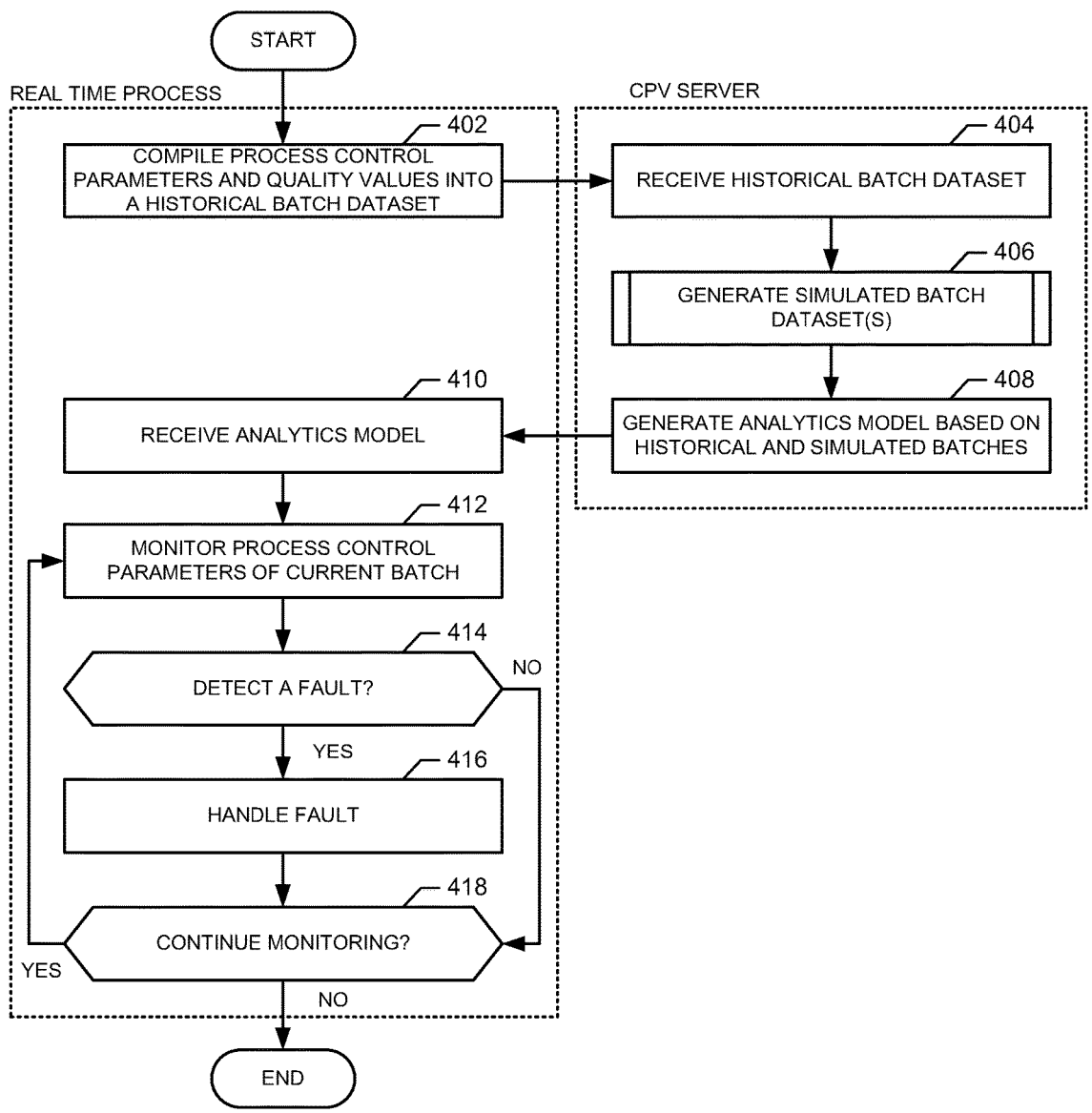
FIG. 4 is a flow diagram representative of an example method that may be executed to implement the process control system of FIG. 1.
Figure 5:
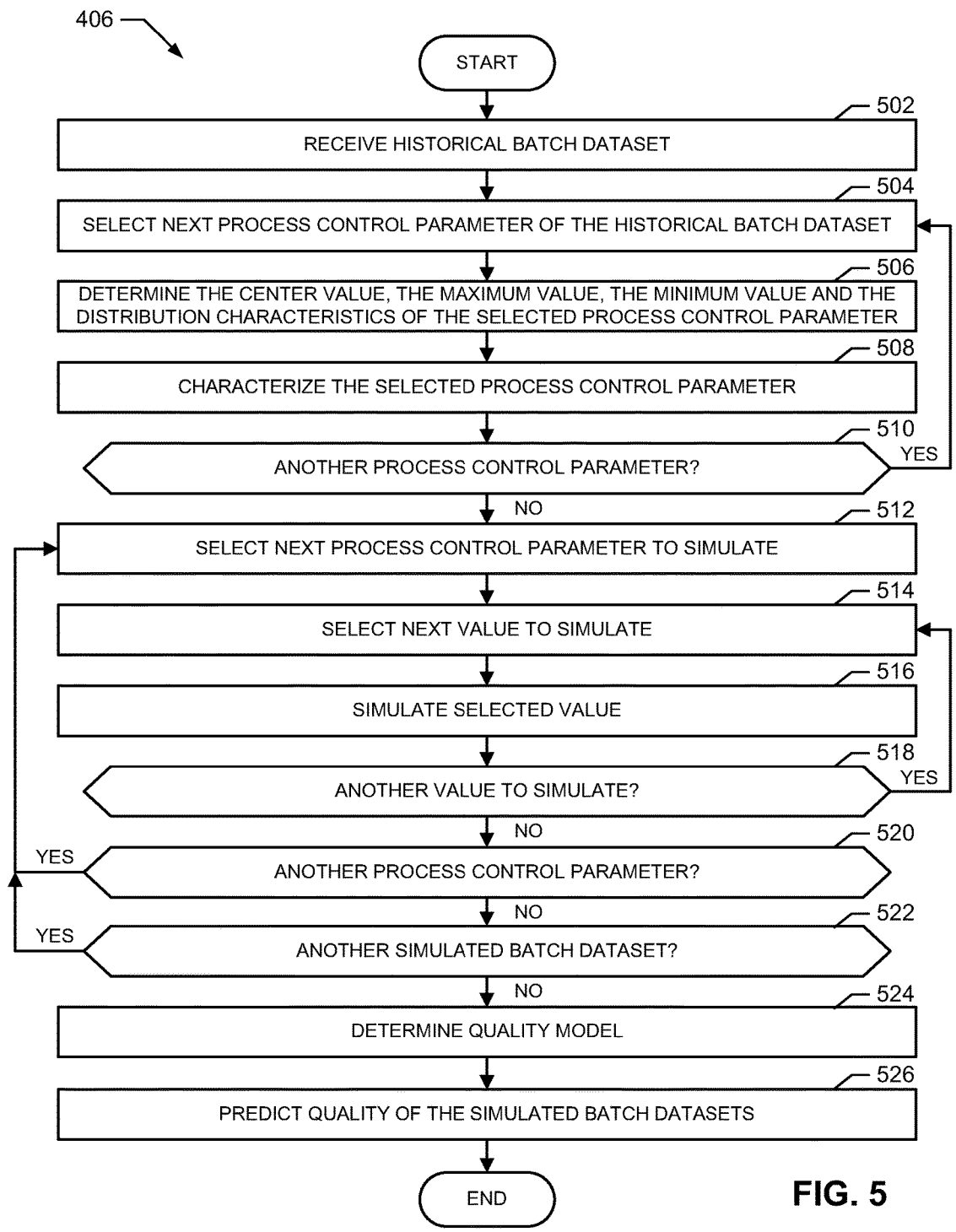
FIG. 5 is a flow diagram representative of an example method that may be executed to implement the simulation server of FIGS. 1 and 2.

A flowchart representative of example methods for implementing the example real time process 102 and the example CPV server 104 of FIG. 1 is shown in FIG. 4. A flowchart representative of example methods for implementing the example simulation server 130 of FIGS. 1 and 3 is shown in FIG. 5. In these examples, the methods may be implemented using a program executed by a processor such as the processor 612 shown in the example processor platform 600 discussed below in connection with FIG. 6. The methods may be embodied in software stored on a tangible computer readable storage medium such as a CD-ROM, a floppy disk, a hard drive, a digital versatile disk (DVD), a Blu-ray disk, or a memory associated with the processor 612, but the entire method and/or parts thereof could alternatively be executed by a device other than the processor 612 and/or embodied in firmware or dedicated hardware. Further, although the example methods are described with reference to the flowcharts illustrated in FIGS. 4 and 5, many other methods of implementing the example real time process 102, the example CPV server 104 and/or the example simulation server 130 may alternatively be used. For example, the order of execution of the blocks may be changed, and/or some of the blocks described may be changed, eliminated, or combined.

As mentioned above, the example methods of FIGS. 4 and 5 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 4 and 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 4 is a flow diagram representative of an example method that may be executed to implement the process control system 100 of FIG. 1. The example method is shown in connection with the real time process 102 and the CPV server 104. The example real time process 102 monitors and controls the production of the product. The example CPV server 104 develops the analytical/statistical model 122 (FIG. 1) that the real time process 102 uses to monitor and control the production of the product. Initially, the host 114 (FIG. 1) of the real time process 102 compiles process control parameters 116 and quality values associated with manufacturing a batch of the product into the historical batch dataset 118 (block 402). In some examples, the quality values included in the historical batch dataset 118 are the quality values 126 produced by the analytics server 120 (FIG. 1). Alternatively, in some examples, the quality values included in the historical batch dataset 118 are separately calculated (e.g., before the analytical/statistical model 122 of FIG. 1 has been generated by the CPV server 104).

The historian 128 (FIG. 1) of the CPV server 104 receives the historical batch dataset 118 from the host 114 of the real time process 102 (block 404). The simulation server 130 uses the historical batch dataset 118 to generate simulated batch datasets 134 (block 406). An example method of generating simulated batch datasets is discussed below in connection with FIG. 6. The example batch analyzer 132 (FIG. 1) receives the historical batch dataset 118 from the example historian 128 and the simulated batch datasets 134 from the simulation server 130 to generate an analytical/statistical model 122 (block 408). In some examples, the batch analyzer 132 uses primary component analysis (PCA) and/or projected latent structure (PLS) to generate the analytical/statistical model 122.

The example analytics server 120 receives the example analytical/statistical models 122 from the example CPV server 104 (block 410). The analytics server 120 monitors the process control parameters 116 generated by a current batch being manufactured by the process control system 100 (block 412). In the illustrated example, the analytics server 120 receives the process control parameters 116 generated by a current batch being manufactured from the host 114. The analytics server 120 analyzes the process control parameters 116 using the analytical/statistical model 122 to determine whether a fault has occurred in the process control system 100 (block 414). For example, the analytics server 120 may detect that a first process control parameter is out of an acceptable range (e.g., as detected by the analytical/statistical model 122) as to jeopardize the quality requirements of the batch. If the analytical/statistical model 122 determines that the fault has occurred, the host 114 handles the fault (block 416). For examples, the host 114 may change settings of the field device(s) 108, produces an alarm, and/or halt the real time process 102 until the fault is corrected.

Otherwise, the analytics server 120 determines that the fault has not occurred, the analytics server 120 determines whether to continue monitoring the process control system 100 (block 418). For example, if the current batch has been completed, the analytics server 120 may determine not to continue to monitor the process control system 100. If the analytics server 120 is to continue monitoring, the analytics server 120 monitors the process control parameters 116 generated by the current batch being manufactured by the process control system 100 (block 412). Otherwise, the method of FIG. 4 ends.

FIG. 5 is a flow diagram representative of an example method that may be executed to implement the simulation server 130 of FIGS. 1 and 3 to generate simulated batch datasets 134 (FIGS. 1 and 3). Initially, the parameter analyzer 302 (FIG. 3) receives the historical batch dataset 118 from the historian 128 (block 502). The example parameter analyzer 302 selects one of the process control parameters 116 included with the historical batch dataset 118 (block 504). Based on the sample values 210a-210t (FIG. 2) of the selected process control parameter 116, the example parameter analyzer 302 determines the center value, the maximum value, the minimum value and/or the distribution characteristics of the selected process control parameter 116 (block 506).

The example parameter analyzer 302 characterizes the selected process control parameter 116 (block 508). In some examples, to characterize the selected process control parameter 116, the parameter analyzer 302 derives an equation that describes the behavior of the selected process control parameter 116. Alternatively, in some examples, the parameter analyzer 302 selects and customizes the equation from a database of equations based on, for example, the field device 108 associated with the selected process control parameter 116. The example parameter analyzer 302 determines whether there is another process control parameter 116 to analyze (block 510). If there is another process control parameter 116 to analyze, the parameter analyzer 302 selects the next process control parameter 116.

Otherwise, if there is not another process control parameter 116 to analyze, the example parameter generator 304 (FIG. 3) selects one of the process control parameters 116 to simulate (block 512). The parameter generator 304 selects one of the sample values 210a-210t to simulate (block 514). The sample value 210a-210t is representative of a sample measurement of the corresponding field device 108 at a particular time. For example, the selected sample value 210a-210t may be representative of the 167th sample measurement of a pressure sensor during the batch. The example parameter generator 304 simulates the selected sample value 210a-210t using the characterization of the selected process control parameter 116 (block 516). In some examples, the parameter generator 304 uses the Monte Carlo method to randomly or pseudo-randomly generate the selected sample value 210a-210t based on the characterization. For example, the characterization of the selected process control parameter 116 may state that the selected sample value 210a-210t is to be within three standard deviations from the center value calculated at block 506. The example parameter generator 304 determines whether there is another sample value 210a-210t to be simulated (block 518). If there is another sample value 210a-210t to be simulated, the example parameter generator 304 selects the next value (block 514). Otherwise, the example parameter generator 304 determines whether there is another process control parameter 116 to simulate (block 520). If there is another process control parameter to simulate, the example parameter generator 304 selects the next process control parameter 116 (block 512).

Otherwise, the example parameter generator 304 determines whether to generate another simulated batch dataset 134. For example, if the threshold quantity of batch datasets is twenty-five, and one historical batch dataset 118 and one simulated batch dataset 134 have been generated, the parameter generator 304 determines to generate another simulated batch dataset 134. If the example parameter generator 304 determines to generate another simulated batch dataset 134, the example parameter generator 304 selects one of the process control parameters 116 to simulate (block 512). Otherwise, the example quality predictor 306 determines a quality model based on the historical batch dataset 118 received at block 502 (block 524). In some examples, the example quality predictor 306 analyzes the process control parameters 116 of the historical batch dataset 118 using minimum mean square errors (MSE) analysis to create the quality model. The example quality predictor 306 predicts quality value(s) for the simulated batch dataset 134 based on the simulated process control parameters 116 based on the quality model determined at block 524. The example method of FIG. 5 then ends.

Figure 6:
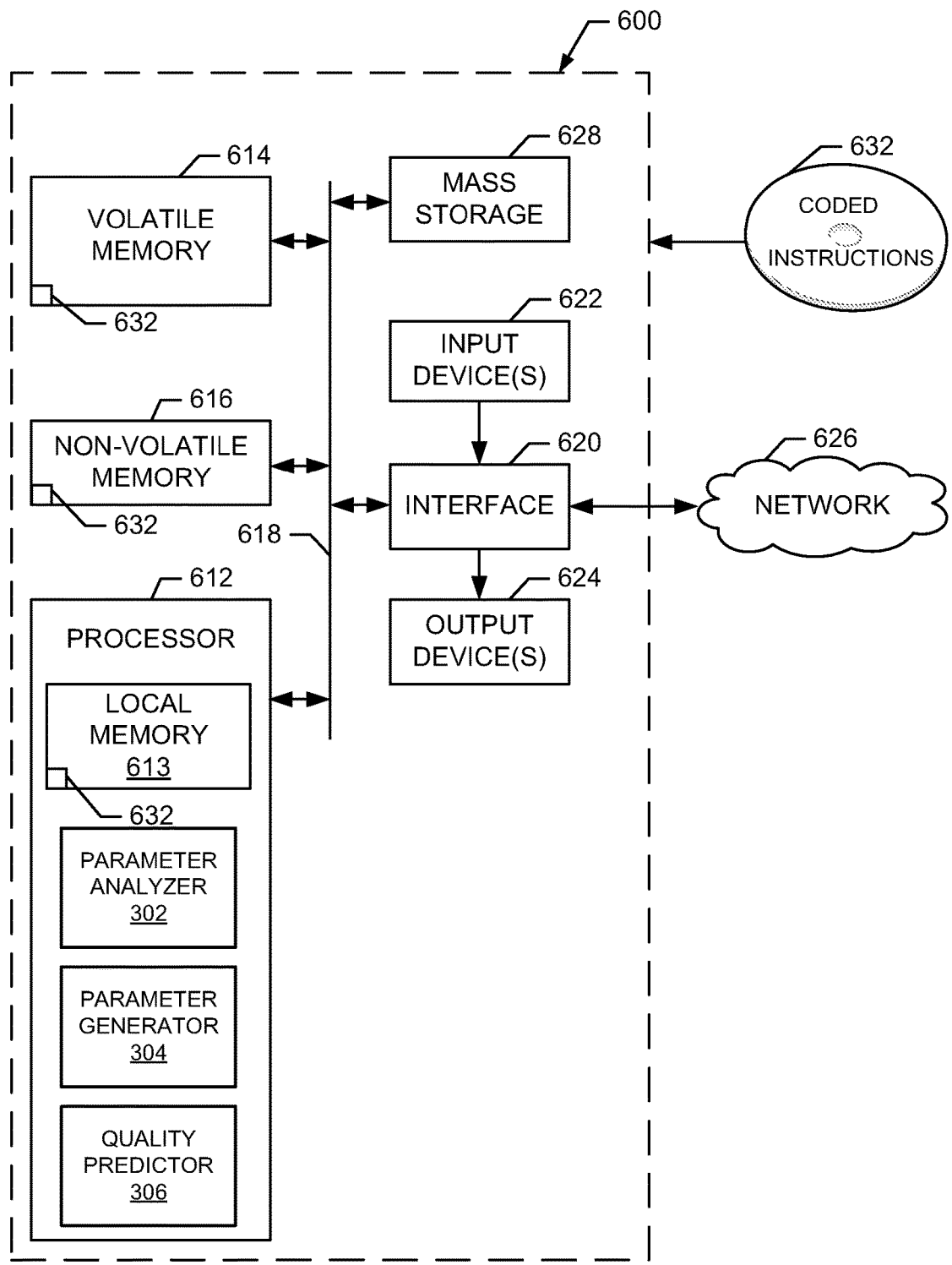
FIG. 6 is a block diagram of an example processor system structured to execute machine readable instructions to perform the methods represented by FIGS. 4 and/or 5 to implement the example process control system of FIG. 1 and/or the simulation server of FIGS. 1 and 2.

FIG. 6 is a block diagram of an example processor platform 600 capable of executing the methods of FIGS. 4 and/or 5 to implement the process control system 100 of FIG. 1 and/or the simulation server 130 of FIGS. 1 and 3. The processor platform 600 can be, for example, a server, a personal computer, a workstation, or any other type of computing device.

The processor platform 600 of the illustrated example includes a processor 612. The processor 612 of the illustrated example is hardware. For example, the processor 612 can be implemented by one or more integrated circuits, logic circuits, microprocessors or controllers from any desired family or manufacturer. In the illustrated example, the processor 612 is structured to include the example parameter analyzer 302, the example parameter generator 304, and the example quality predictor 306.

The processor 612 of the illustrated example includes a local memory 613 (e.g., a cache). The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a memory controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and commands into the processor 612. The input device(s) can be implemented by, for example, a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 620 of the illustrated example, thus, typically includes a graphics driver card, a graphics driver chip or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

Coded instructions 632 implementing the methods of FIGS. 4 and/or 5 may be stored in the mass storage device 628, in the volatile memory 614, in the non-volatile memory 616, and/or on a removable tangible computer readable storage medium such as a CD or DVD.

From the foregoing, it will be appreciated that the examples disclosed above facilitate CPV when relatively few batches have been manufactured by a process control system. Additionally, the examples disclosed allow faults to be detected and responded to in the manufacturing process. In some examples, the faults are detected based on a combination of process control parameters from different field devices in which, if uncorrected, would negatively affect the quality of the product.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method comprising:
   determining distribution characteristics for a plurality of process control parameters obtained from one or more field devices of a process control system, the process control parameters being based on a first set of historical batch datasets, respective ones of the historical batch datasets being measured while manufacturing corresponding ones of first batches at corresponding ones of first times;
   generating a model batch based on the distribution characteristics of the plurality of process control parameters;
   determining a quantity of simulated batch datasets to be included in a first set of simulated batch datasets, the first set of simulated batch datasets corresponding to a first set of simulated batches, the quantity being equal to a difference between a predetermined threshold number of total batch datasets and a total number of the historical batch datasets within the first set of historical batch datasets;
   generating the first set of simulated batch datasets based on the quantity by, for each one of the simulated batches of the first set of simulated batches:
      generating values for the plurality of process control parameters based on the model batch; and
      determining a quality prediction based on the generated values;

generating a model based on the first set of simulated batch datasets and the first set of historical batch datasets; and implementing the model via a server during a manufacture of a second batch at a second time subsequent to the first times to determine whether a fault has occurred in the process control system during the manufacture of the second batch, the implementing of the model to facilitate continued process verification and fault detection when the total number of the historical batch datasets within the first set of historical batch datasets is less than the predetermined threshold number of total batch datasets.

2. The method as defined in claim 1, wherein, for each one of the simulated batches of the first set of simulated batches, the values for the plurality of process control parameters are generated by a random or pseudo-random calculation.

3. The method as defined in claim 1, further comprising, after the manufacture of the second batch:

determining updated distribution characteristics for the plurality of process control parameters based on the first set of historical batch datasets and an additional historical batch dataset, the additional historical batch dataset including the plurality of process control parameters measured while manufacturing the second batch;

generating an updated model batch based on the updated distribution characteristics of the plurality of process control parameters;

determining an updated quantity of simulated batch datasets to be included in a second set of simulated batch datasets, the second set of simulated batch datasets corresponding to a second set of simulated batches, the updated quantity being equal to a difference between the predetermined threshold number of total batch datasets and a combined total number of the historical batch datasets within the first set of historical batch datasets and the additional historical batch dataset;

generating a second set of simulated batch datasets based on the updated quantity; and generating an updated model based on the second set of simulated batch datasets, the first set of historical batch dataset, and the additional historical batch dataset.

4. The method as defined in claim 1, wherein the model batch includes characterizations of the plurality of process control parameters based on the distribution characteristics.

5. The method as defined in claim 1, wherein determining the quality prediction based on the generated values further includes generating a quality model based on quality metrics included with the first set of historical batch datasets.

6. The method of claim 1, wherein the fault corresponds to at least one of the process control parameters being out of an acceptable range.

7. The method of claim 1, further comprising generating an alarm in response to determining that the fault has occurred.

8. The method of claim 1, further comprising changing a setting of at least one of the field devices in response to determining that the fault has occurred.

9. The method of claim 1, further comprising halting the manufacture of the second batch in response to determining that the fault has occurred.

10. An apparatus comprising:

a parameter analyzer to:

determine distribution characteristics for a plurality of process control parameters obtained from one or more filed devices of a process control system, the process control parameters being based on a first set of historical batch datasets, respective ones of the historical batch datasets being measured while manufacturing corresponding ones of first batches at corresponding ones of first times; and generate a model batch based on the determined distribution characteristics for the plurality of process control parameters;

a parameter generator to:

determine a quantity of simulated batch datasets to be included in a first set of simulated batch datasets, the first set of simulated batch datasets corresponding to a first set of simulated batches, the quantity being equal to a difference between a predetermined threshold number of total batch datasets and a total number of the historical batch datasets within the first set of historical batch datasets; and for each one of the quantity of simulated batches of the first set of simulated batches, generate values for the plurality of process control parameters based on the model batch, the generated values to be included in the first set of simulated batch datasets;

a quality predictor to, for each one of the quantity of simulated batches of the first set of simulated batches, determine a quality prediction based on the generated values, the quality prediction to be included in the first set of simulated batch datasets;

a batch analyzer to generate a model based on the first set of simulated batch datasets and the first set of historical batch datasets; and a server to implement the model during a manufacture of a second batch at a second time subsequent to the first times to determine whether a fault has occurred in the process control system during the manufacture of the second batch, the implementing of the model to facilitate continued process verification and fault detection when the total number of the historical batch datasets within the first set of historical batch datasets is less than the predetermined threshold number of total batch datasets.

11. The apparatus as defined in claim 10, wherein, for each one of the simulated batches of the first set of simulated batches, the values for the plurality of process control parameters are generated by random or pseudo-random calculation.

12. The apparatus as defined in claim 10, wherein after the manufacture of the second batch:

the parameter analyzer is to:

determine updated distribution characteristics of the plurality of process control parameters based on the first set of historical batch datasets and an additional historical batch dataset, the additional batch dataset including the plurality of process control parameters measured while manufacturing the second batch; and generate an updated model batch based on the updated distribution characteristics of the plurality of process control parameters;

the parameter generator is to:

determine an updated quantity of simulated batch datasets to be included in a second set of simulated batch datasets, the second set of simulated batch datasets corresponding to a second set of simulated batches, the updated quantity being equal to a difference between the predetermined threshold number of total batch datasets and a combined total number of the historical batch datasets within the first set of historical batch datasets and the additional historical batch dataset; and generate a second set of simulated batch datasets based on the updated quantity; and the batch analyzer is to generate an updated model based on the second set of simulated batch datasets, the first set of historical batch datasets, and the additional historical batch dataset.

13. The apparatus as defined in claim 10, wherein the model batch includes characterizations of the plurality of process control parameters based on the distribution characteristics.

14. The apparatus as defined in claim 10, wherein to determine the quality prediction based on the generated values, the quality predictor is to generate a quality model based on quality metrics included with the first set of historical batch datasets.

15. A non-transitory computer readable medium comprising instructions which, when executed, cause a machine to at least:

determine distribution characteristics for a plurality of process control parameters obtained from one or more filed devices of a process control system, the process control parameters being based on a first set of historical batch datasets, respective ones of the historical batch datasets being measured while manufacturing corresponding ones of first batches at corresponding ones of first times;

generate a model batch based on the distribution characteristics of the plurality of process control parameters;

determine a quantity of simulated batch datasets to be included in a first set of simulated batch datasets, the first set of simulated batch datasets corresponding to a first set of simulated batches, the quantity being equal to a difference between a predetermined threshold number of total batch datasets and a total number of the historical batch datasets within the first set of historical batch datasets;

generate the first set of simulated batch datasets based on the quantity by, for each one of the simulated batches of the first set of simulated batches:

generating values for the plurality of process control parameters based on the model batch; and determining a quality prediction based on the generated values;

generate a model based on the first set of simulated batch datasets and the first set of historical batch datasets; and implement the model during a manufacture of a second batch at a second time subsequent to the first times to determine whether a fault has occurred in the process control system during the manufacture of the second batch, the implementing of the model to facilitate continued process verification and fault detection when the total number of the historical batch datasets within the first set of historical batch datasets is less than the predetermined threshold number of total batch datasets.

16. The non-transitory computer readable medium as defined in claim 15, wherein, for each one of the simulated batches of the first set of simulated batches, the values for the plurality of process control parameters are generated by a random or pseudo-random calculation.

17. The non-transitory computer readable medium as defined in claim 15, wherein after the manufacture of the second batch, the instructions, when executed, cause the machine to:

determine updated distribution characteristics for the plurality of process control parameters based on the first set of historical batch datasets and an additional historical batch dataset, the additional historical batch dataset including the plurality of process control parameters measured while manufacturing the second batch;

generate an updated model batch based on the updated distribution characteristics of the plurality of process control parameters;

determine an updated quantity of simulated batch datasets to be included in a second set of simulated batch datasets, the second set of simulated batch datasets corresponding to a second set of simulated batches, the updated quantity being equal to a difference between the predetermined threshold number of total batch datasets and a combined total number of the historical batch datasets within the first set of historical batch datasets and the additional historical batch dataset;

generate a second set of simulated batch datasets based on the updated quantity; and generate an updated model based on the second set of simulated batch datasets, the first set of historical batch datasets, and the additional historical batch dataset.

18. The non-transitory computer readable medium as defined in claim 15, wherein the model batch includes characterizations of the plurality of process control parameters based on the distribution characteristics.

19. The non-transitory computer readable medium as defined in claim 15, wherein to determine the quality prediction based on the generated values, the instructions cause the machine to generate a quality model based on quality metrics included with the first set of historical batch datasets.

* * * * *